United States Patent
Yun et al.

(10) Patent No.: US 7,820,016 B2
(45) Date of Patent: Oct. 26, 2010

(54) SPUTTERING APPARATUS AND METHOD OF PREVENTING DAMAGE THEREOF

(75) Inventors: Jinhee Yun, Gyeongbuk (KR); Munik Na, Gwangju (KR); Seunglyul Lee, Gyeongbuk (KR); Kyoungshik Kim, Gyeongbuk (KR); Junhyung Park, Seoul (KR); Sanghyo Park, Busan (KR); Jaehoon Choi, Seoul (KR); Kagkyu Jung, Gyeonggi-do (KR); Jaekwang Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1118 days.

(21) Appl. No.: 11/320,565

(22) Filed: Dec. 30, 2005

(65) Prior Publication Data

US 2006/0289292 A1 Dec. 28, 2006

(30) Foreign Application Priority Data

Jun. 27, 2005 (KR) ...................... 10-2005-0055521

(51) Int. Cl.
*C23C 14/00* (2006.01)
*C23C 14/32* (2006.01)
*C23C 16/00* (2006.01)

(52) U.S. Cl. ................... 204/192.12; 118/728
(58) Field of Classification Search ................. 118/729, 118/728; 216/54; 269/289 R; 204/192.12
See application file for complete search history.

(56) References Cited

U.S. PATENT DOCUMENTS

| | | | | | |
|---|---|---|---|---|---|
| 5,860,640 | A | * | 1/1999 | Marohl et al. | 269/289 R |
| 6,846,396 | B2 | * | 1/2005 | Perrin | 204/298.11 |
| 2004/0232109 | A1 | * | 11/2004 | Yoshinaga | 216/54 |
| 2005/0150463 | A1 | * | 7/2005 | He et al. | 118/729 |

FOREIGN PATENT DOCUMENTS

| | | | | |
|---|---|---|---|---|
| JP | 62136238 | A | * | 6/1987 |
| JP | 63118062 | A | * | 5/1988 |
| JP | 4-325679 | A | | 11/1992 |
| JP | 06188303 | A | * | 7/1994 |
| JP | 2005-29850 | | | 2/2005 |
| KR | 10-2004-0033403 | A | | 4/2004 |

OTHER PUBLICATIONS

Office Action issued in Korean Application No. 10-2005-0055521.

* cited by examiner

*Primary Examiner*—Rodney G McDonald
*Assistant Examiner*—Michael Band
(74) *Attorney, Agent, or Firm*—Morgan Lewis & Bockius LLP

(57) ABSTRACT

A sputtering apparatus includes a container; a plate for supporting the container; a first attachment for attaching the container to the plate; and a second attachment for less tightly attaching the container to the plate than through the first attachment.

4 Claims, 4 Drawing Sheets

SPUTTERING APPARATUS AND METHOD OF PREVENTING DAMAGE THEREOF

This application claims the benefit of Korean Patent Application No. P2005-055521 filed in Korea on Jun. 27, 2005, which is hereby incorporated by reference in its entirety.

BACKGROUND OF THE INVENTION

1. Field of the Invention

The present invention relates to a sputtering apparatus, and more particularly, to a sputtering apparatus configured to prevent damage to a container.

2. Description of the Related Art

When substrates for semiconductor wafers or liquid crystal panels are manufactured, they are subjected to various repeating treatment processes, such as thin film processing and etching. A sputtering apparatus is generally used for such thin film processing. A sputtering apparatus is an apparatus for forming thin film, for example, and is an indispensable component in the manufacturing of semiconductor devices and liquid crystal display devices (LCDs). In light of the complicated processes required for manufacturing large panels, and a need to increase manufacturing yields, robotic technology is being increasingly used for automating the operation of sputtering apparatuses.

FIG. 1 is a schematic view of a related art cluster-type sputtering apparatus. Referring to FIG. 1, a related art cluster-type sputtering apparatus includes a substrate retaining portion 108 for retaining a substrate 107 over a specified duration, and a sputtering portion 109 for sputtering the substrate 107 retained by the substrate retaining portion 108. The substrate retaining portion 108 includes a substrate retaining plate 110 that moves horizontally or vertically by means of a shaft 111.

A container 118 is provided at the front of the substrate retaining plate 110. The container 118 can be formed of quartz or pyrex, for example. Quartz and pyrex have to be handled carefully because they contain a large amount of glass, and are susceptible to damage from outside pressures.

A sheath heater 119 is provided at the rear of the substrate for controlling temperature. The sheath heater 119 may be installed within the substrate retaining plate 110.

The substrate 107 to be treated is placed on the container 118. In this case, heat generated by the sheath heater 119 can be transmitted to the substrate 107 through the container 118. The temperature of the container 118 must be uniformly maintained to form a uniform film on the substrate 107. Thus, the container 118 is made of an appropriately selected material.

A vacuum pump 117 is provided for discharging air and creating a vacuum in the sputtering apparatus. A discharge nozzle (not shown) is provided at the bottom of the substrate retaining plate 110 for discharging a gas, for example Ar gas.

The sputtering portion 109 includes a cathode 114 for supplying a negative voltage, a target 115 provided at the front of the cathode 114 for discharging a target material through collision created by positive ions of a gaseous plasma, and a magnet 116 provided at the rear of the cathode 114 for forming a magnetic field around the target 115 to generate more positive ions. A shield magnet 112 is provided along an inner surface of a main body 113 to separate the substrate retaining portion 108 from the sputtering portion 109.

During sputtering operation, the substrate 107 is positioned on the container 118. Then, the shaft 111 moves the substrate retaining plate 110 vertically, so that the substrate 107 faces the target 115. Next, Ar gas, for example, is discharged from the discharge nozzle. Then, plasma is generated by applying a high voltage. Here, ionic Ar+ ions collide with the target 115, and particles separated from the target 115 are deposited on the substrate 107.

As described above, the substrate 107 is positioned on the container 118. The container 118 usually has a diameter larger than that of the substrate 107. Thus, when the substrate 107 is positioned on the container 118, the container 118 is not covered entirely by the substrate 107. Thus, during plasma generation, particles from the target 115 adhere to uncovered portions of the surface of the container 118. After continued plasma generation, these particles from the target 115 peel off from the uncovered portions of the surface of the container 118. The target material that peels off becomes an impurity that adheres to and contaminates the substrate 107.

Moreover, the uncovered portions of the surface of the container 118 is easily damaged by the high-temperature plasma.

Therefore, in various sputtering apparatuses, the container 118 is replaced by a new container 118, or the container 118 is removed, thoroughly washed to discard the target material adhered onto the surface of the container 118, and then re-installed in the sputtering apparatus. When transporting the container 118 to be washed, careless handling can lead to damage of the container.

FIG. 2 is a plan view of the related art container of FIG. 1. Referring to FIG. 2, fixing holes 118a and 118b are provided on opposite sides of the container 118. The container 118 is fixed to the substrate 107 retaining plate 110 through these fixing holes 118a and 118b.

The container 118 expands due to the heat generated by the high temperature plasma. The opposite sides of the container 118 are fixed to the substrate retaining plate 110, so that there is no freedom of movement for the container 118. As such, the container 118 is easily damaged from heat expansion.

As discussed above, the related art cluster-type sputtering apparatus may cause contamination of the substrate due to the adherence and subsequent peeling off of target material on exposed portions of the container. Moreover, the related art container can be easily damaged due to expansion caused by the high temperature plasma.

SUMMARY OF THE INVENTION

Accordingly, the present invention is directed to a sputtering apparatus that substantially obviates one or more problems due to limitations and disadvantages of the related art.

An object of the present invention is to provide a sputtering apparatus that is damage resistant.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a sputtering apparatus includes a container; a plate for supporting the container; a first attachment for attaching the container to the plate; and a second attachment for less tightly attaching the container to the plate through the first attachment.

In another aspect, a sputtering apparatus includes a plate; and a container having a first container fixing hole and a second container fixing hole formed on opposite sides of the container, wherein the container is attached through the first container fixing hole to the plate, and less tightly attached through the second container fixing hole to the plate than through the first container fixing hole.

In another aspect, a method for preventing damage to a sputtering apparatus includes attaching a container to a plate through a first container fixing hole provided at one side of the container; and less tightly attaching the container to the plate through a second container fixing hole provided at an opposite side of the container than through the first container fixing hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EXEMPLARY EMBODIMENTS

Reference will now be made in detail to exemplary embodiments of the present invention, examples of which are illustrated in the accompanying drawings. Wherever possible, the same reference numbers will be used throughout the drawings to refer to the same or like parts.

Figure 1:
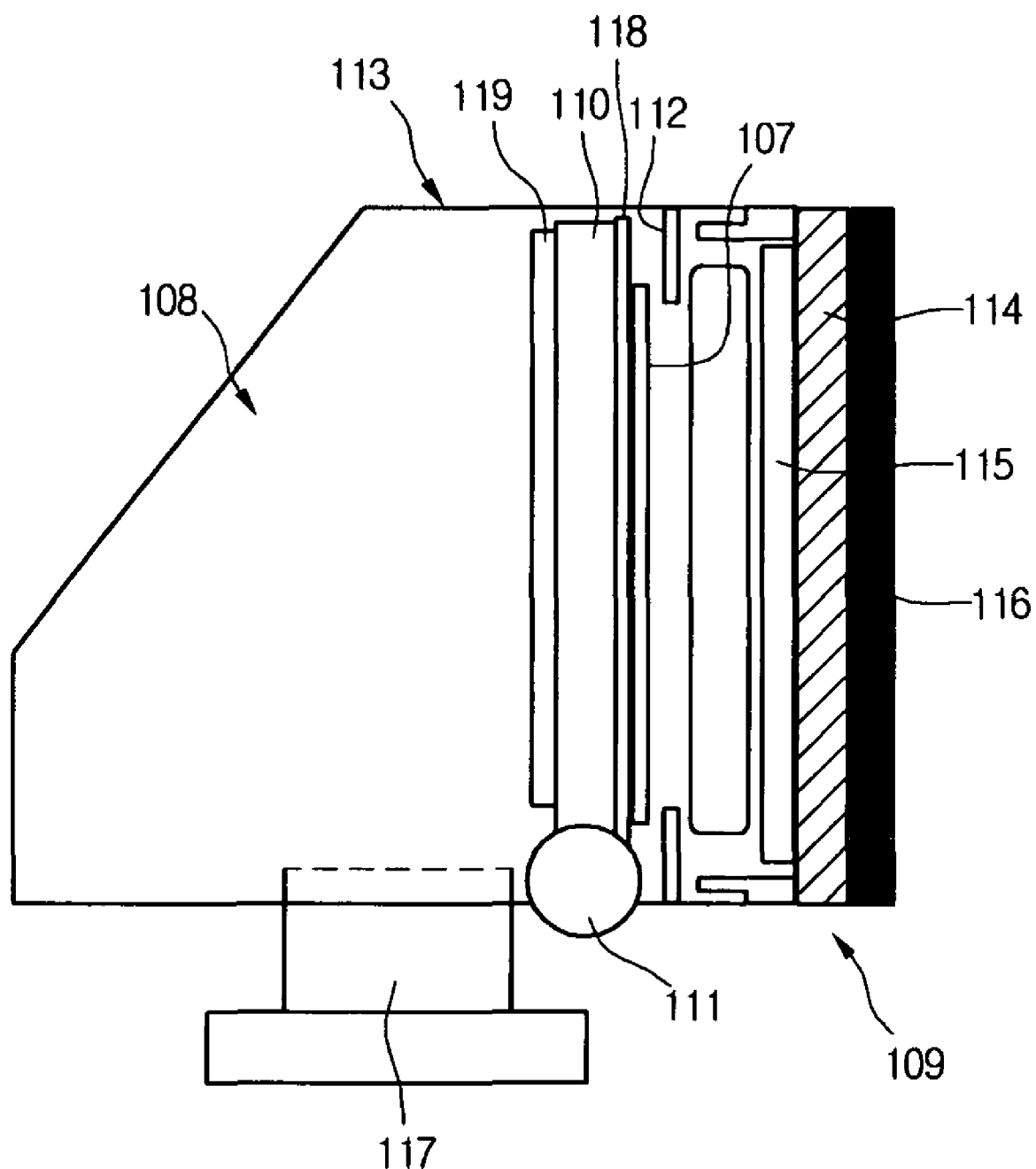
FIG. 1 is a schematic view of a related art cluster-type sputtering apparatus.
Figure 2:
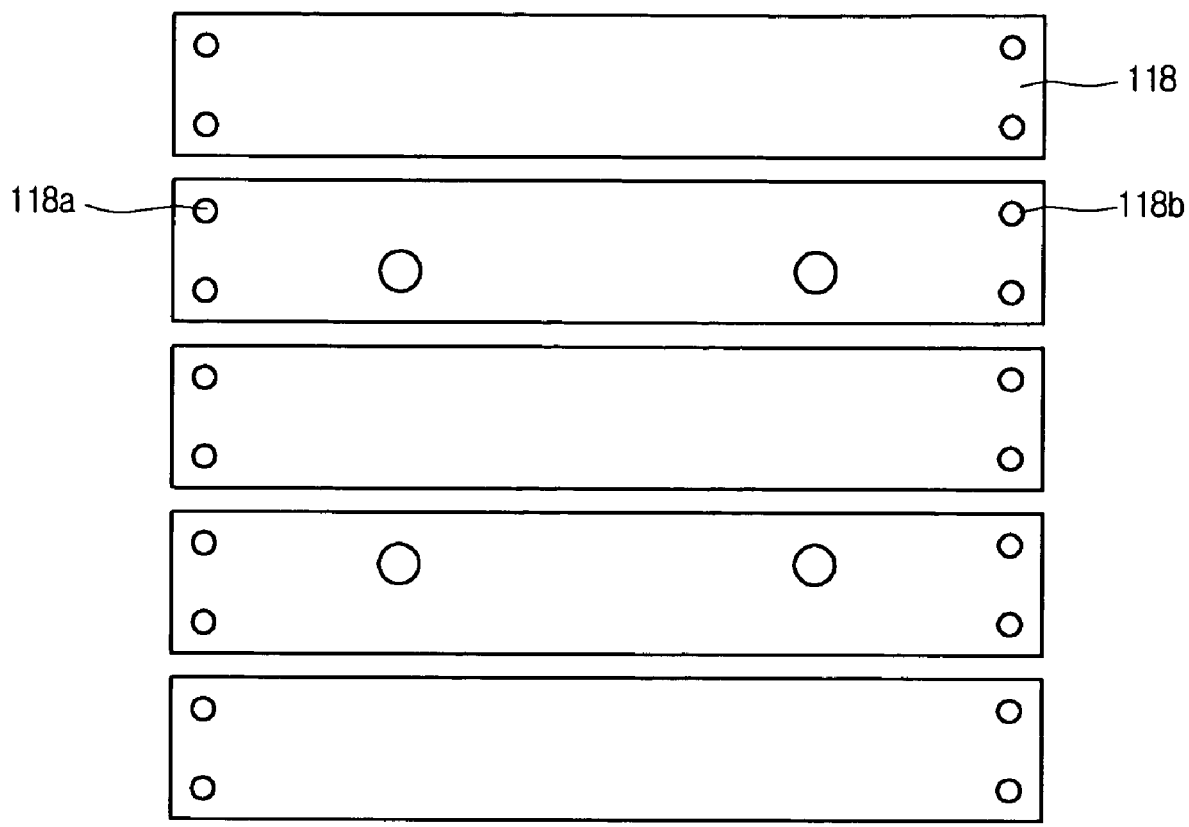
FIG. 2 is a plan view of the related art container of FIG. 1.
Figure 3:
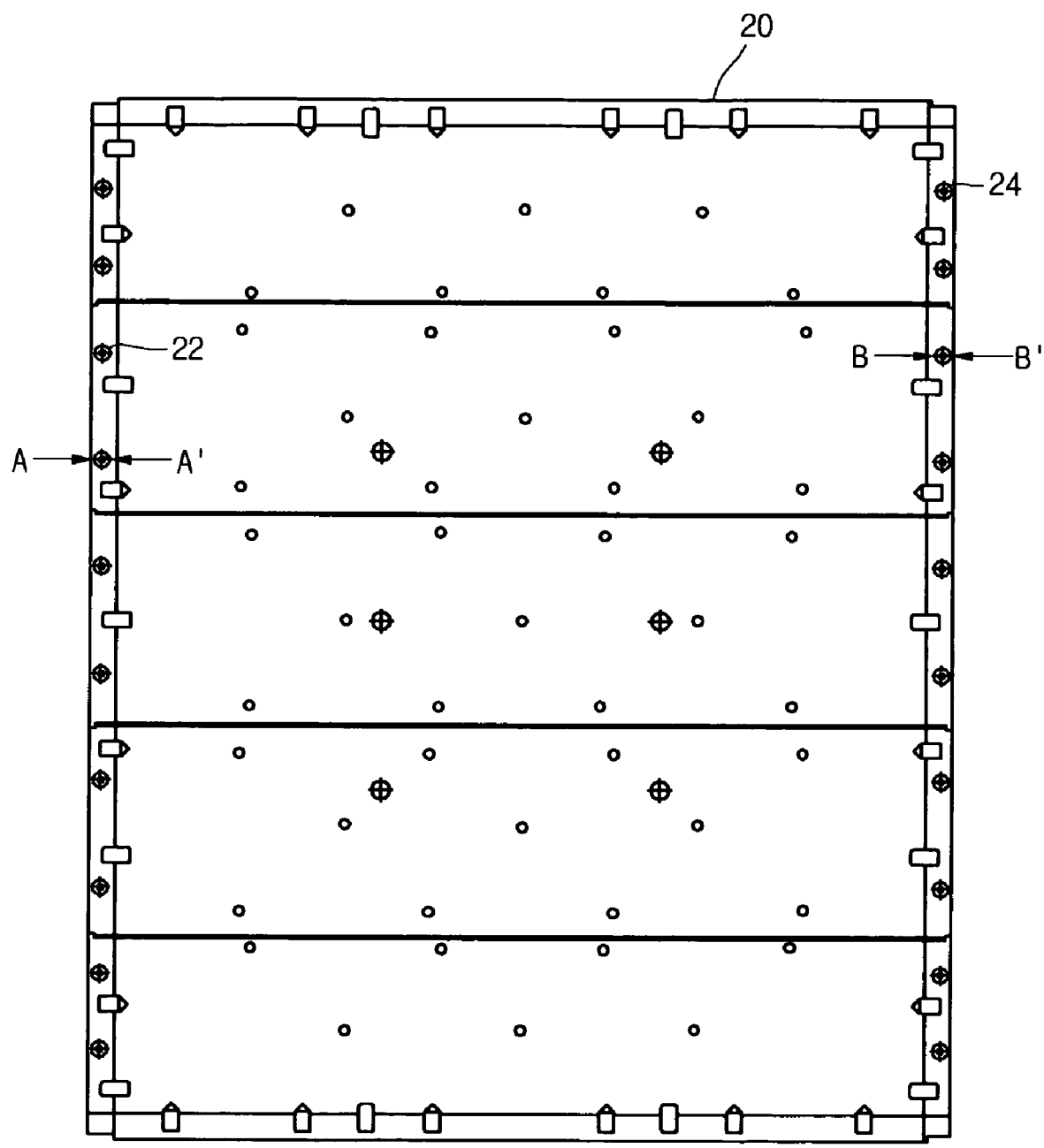
FIG. 3 is a plan view of an exemplary container according to an embodiment of the present invention.

FIG. 3 is a plan view of an exemplary container according to an embodiment of the present invention. Referring to FIG. 3, a container 20 is fixed and connected to a plate (not shown). The plate is provided on a clustering-type sputtering apparatus. A shaft connected to the plate provides vertical and horizontal motion for the plate.

A heater (not shown) can be provided for generating heat. In an embodiment, the heater can be provided inside the plate. In an another embodiment, the heater can be provided below the plate. The container 20 is maintained at a uniform temperature by transferring heat from the heater to the container 20. In this case, for thin film processing, the container 20 can maintain a uniform temperature by receiving heat through a substrate seated on the container 20 or contact with the container 20. Thus, by processing the thin film through the plasma process while the substrate is maintained at a uniform temperature, an even thin film can be formed on the substrate.

Container fixing holes 22 and 24 are formed on either side of the container 20 for attaching the container 20 to the plate. The diameters of the container fixing holes 22 and 24 on either side can be different. For example, the container fixing hole 24 at a first side of the container 20 may have a diameter that is larger than the container fixing hole 22 at a second side of the container 20. One reason for providing different diameters for the container fixing holes 22 and 24 is to loosely attach one of the sides of the container 20 to the plate through the larger container fixing hole 24. Thus, the container 20 can be attached more tightly through the container fixing hole 22 than through the container fixing hole 24. Alternatively, the container 20 can be attached less tightly through the container fixing hole 24 than through the container fixing hole 22.

Figure 4A:
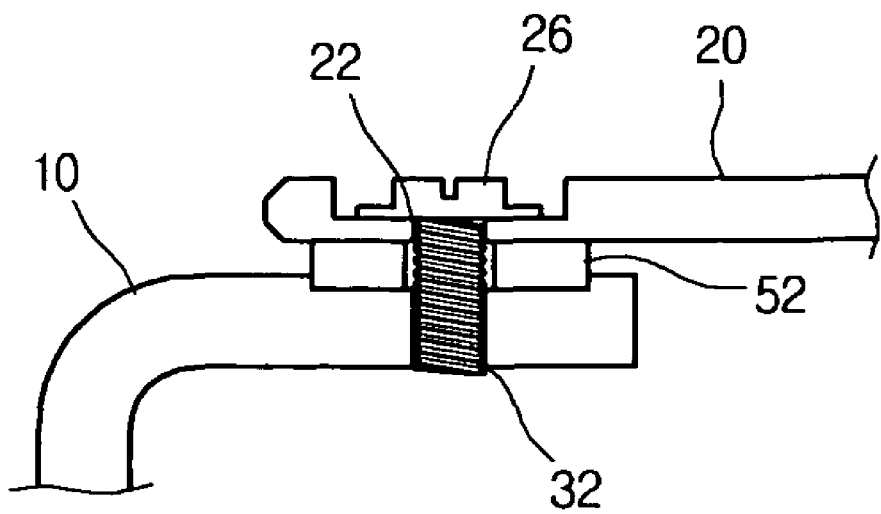
FIG. 4A is a cross-sectional view of an exemplary fixing hole along line A-A' of FIG. 3.

FIG. 4A is a cross-sectional view of an exemplary fixing hole along line A-A' of FIG. 3. Referring to FIG. 4A, the container 20 is tightly attached to a plate 10 through the container fixing hole 22 on the first side of the container 20. For this purpose, a plate fixing hole 32 is provided through the plate 10 to correspond to container fixing hole 22 on the first side of the container 20. In an embodiment, the container fixing hole 22 on the first side of the container 20 and the corresponding plate fixing hole 32 may be both threaded for screws. Thus, a screw 26 can be used to tightly attach the container 20 to the plate 10 by screwing through the first side container fixing hole 22 of the container 20 and into the plate fixing hole 32 of the plate.

Figure 4B:
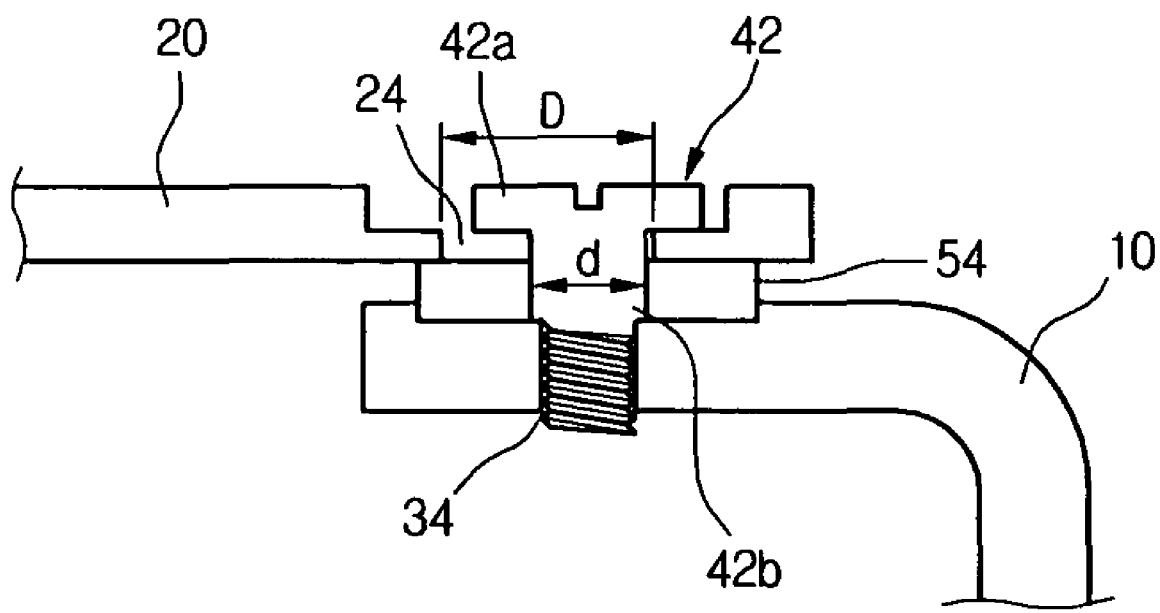
FIG. 4B is a cross-sectional view of an exemplary fixing hole along line B-B' of FIG. 3.

FIG. 4B is a cross-sectional view of an exemplary fixing hole along line B-B' of FIG. 3. Referring to FIG. 4B, the container 20 is loosely attached to the plate 10 through a container fixing hole 24 on the second side of the container 20. For this purpose, a plate fixing hole 34 is formed on the plate 10 to correspond to the container fixing hole 24 on the second side of the container 20. In an embodiment, screw threads are formed in the plate fixing hole 34 of the plate 10 corresponding to the container fixing hole 24, but not in the container fixing hole 24.

As shown in FIGS. 4A and 4B, buffers 52 and 54 can be interposed between the container 20 and the plate 10 to prevent direct contact between the container 20 and the plate 10 when they are attached by the screws 26 and 42.

In an embodiment, the diameter of the container fixing hole 24 on the second side of the container 20 is larger than the container fixing hole 22 on the first side of the container 20. Accordingly, the screw 42 used in the second side container fixing hole 24 is shaped differently from the screw used in the first side container fixing hole 22. For example, the screw 42 includes a column portion 42b inserted through the second side container fixing hole 24 and a head portion 42a integrally formed with the column portion 42b and having a diameter that is at least larger than the diameter of the second side container fixing hole 24. Thus, the screw 42 can cover the surrounding area of the second side container fixing hole 24 of the container 20. The column portion 42b may have a diameter narrower by a specified gap than the diameter of the second side container fixing hole 24. For instance, if the diameter of the column portion 42b is "d," and the second side fixing hole has a diameter "D," the diameter "d" of the column 42b may lie within a range of 0.3 D-0.7 D.

Accordingly, the screw 42 is not tightly attached on the second side container fixing hole 24 but passes through it, and fastens into the threads formed in the plate fixing holes 32 and 34 corresponding to the container fixing hole 24. Thus, the screw 42 is not fixed to the second side container fixing hole 24, but is attached to the plate fixing hole 34.

According to an embodiment of the present invention, the first side of the container 20 is attached to the plate 10 by fastening the screw 26 into the threaded container fixing hole 22 and the corresponding threaded plate fixing hole 32. Thus, the first side container fixing hole 22 of the container 20 is tightly attached by the screw 26 to the plate 10 through the container fixing hole 26 and the plate fixing hole 32. On the other hand, the diameter of the container fixing hole 24 is larger than the diameter of the container fixing hole 22. Moreover, the container fixing hole 24 is not threaded while the corresponding plate fixing hole 34 is threaded for a screw. Thus, the screw 42 passes through the container fixing hole 24 on the second side of the container 20 and is only screwed to the plate fixing hole 34. Accordingly, the container 20 is attached more tightly through the container fixing hole 22 than through the container fixing hole 24. Alternatively, the container 20 is attached less tightly through the container fixing hole 24 than through the container fixing hole 22. Thus, when the container 20 expands due to heat, the space provided around the column portion 42b of the screw 42 allows the container 20 to expand around the second side fixing screw 24 without being damaged. Thus, the container 20 is not damaged by heat-induced expansion because one of the container fixing holes 22 and 24 is not tightly attached to the plate 10.

As described above, damage to the container can be prevented by changing its connecting structure. For example, the connecting structure of the container 20 is changed, so that one of the container fixing holes 22 ad 24 is loosely attached to the plate 10. That is, the container 20 is more tightly attached through container fixing hole 22 than through container fixing hole 24. Thus, the container fixing hole 22 and the corresponding plate fixing hole 32 are threaded so that a screw 26 is tightly fastened through both of the container fixing hole 22 and the corresponding plate fixing hole 32. However, the container fixing hole 24 on the second side has a diameter larger than that of the container fixing hole 22 on the first side, and no threading is provided on the container fixing hole 24, while only the plate fixing hole 34 is threaded. Accordingly, a screw 42 slides through the container fixing hole 24 and is only screwed into the plate fixing hole 34, allowing the container 20 to move relatively freely around the screw 42. Thus, when the container 20 expands due to heat, the space provided around the column portion 42b of the screw 42 allows the container 20 to expand around the second side fixing screw 24 without being damaged. Thus, the container 20 is not damaged by heat-induced expansion because one of the container fixing holes 22 and 24 is less tightly attached to the plate 10.

In another embodiment, the container can be made of a different material to prevent damage to the container. By manufacturing the container with a material that is damage-resistant and highly heat-conductive, damage to the container can be prevented. Alternatively, damage to the container can be prevented by changing both its connecting structure and the material it is made of.

For example, titanium is a material with high strength and heat conductivity. By illuminating the metal titanium through a surface treatment (ABB), target material that does not cover a substrate can be prevented from being deposited on the container during thin film manufacturing. Other metals besides titanium may be used.

Due to titanium's high heat conductivity, when a container is made of titanium, a lower heating temperature can be used in comparison to pyrex. For example, a pyrex container requires a heating temperature of about 220° C. to maintain a substrate temperature of 120° C. In contrast, maintaining the same substrate temperature can be obtained by heating a titanium container to about 180° C. Thus, energy is saved by using a titanium container.

Moreover, due to the high strength of titanium, a container made of titanium will not be damaged during transport or by high temperature plasma. Moreover, titanium is known to have a higher heat expansion than pyrex.

In an embodiment of the present invention, a liquid crystal panel is constructed, by subjecting the substrate various repeating treatment processes, such as thin film processing and etching. The sputtering apparatus described above in the various embodiments can be used for such thin film processing.

In an embodiment, a liquid crystal display (LCD) device is formed by attaching a thin film transistor (TFT) array substrate and a color filter (CF) substrate together to face each other with a specified cell gap therebetween, and filling the cell gap with a liquid crystal material. A plurality of gate lines are arranged at regular intervals along a horizontal direction and a plurality of data lines are arranged at regular intervals along a vertical direction on the TFT array substrate to cross each other. Crossings of the data lines with the gate lines define pixel regions. Each pixel region includes a switching device and a pixel electrode. In addition, red, green and blue color filters corresponding to the pixel regions are formed on the CF substrate. A black matrix is formed in a mesh shape that encompasses an outer edge of the color filters. The black matrix prevents color interference of light passing through the pixel regions. Furthermore, a common electrode is formed on the CF substrate. The common electrode and the pixel electrode generate an electric field through the liquid crystal material. The array substrate and the color filter substrate can each be processed through the sputtering device described in anyone of the above described embodiments, or equivalents thereof.

It will be apparent to those skilled in the art that various modifications and variations can be made in the sputtering apparatus of the present invention without departing from the spirit or scope of the invention. Thus, it is intended that the present invention cover the modifications and variations of this invention provided they come within the scope of the appended claims and their equivalents.

What is claimed is:

1. A method of sputtering to prevent damage to a sputtering apparatus, comprising:

attaching a container to a plate through a first container fixing hole provided at a front side of the container by screwing a first screw without forming a gap between a head portion of the first screw and a first buffer; and screwing the container only to the plate by sliding a second screw through a second container fixing hole provided at the front side of the container positioned opposite to the first container fixing hole, wherein the second container fixing hole is larger than the first container fixing hole, wherein including inserting a column portion of the second screw through the second container fixing hole and forming a head portion of the second screw integrally with the column portion, the head portion having a diameter larger than the diameter of the second container fixing hole, and wherein the column portion of the second screw has a diameter narrower than the diameter of the second container fixing hole thereby forming a gap between the head portion of the second screw and a second buffer, wherein both sides of the container is disposed on the plate, wherein the second container fixing hole is configured to prevent damage when the sputtering apparatus expands by heat, wherein a substrate is on the container, and wherein the first and second buffers are interposed between the container and the plate.

2. The method of claim 1, further comprising threading the first container fixing hole, and while leaving unthreaded the second container fixing hole.

3. The method of claim 2, wherein the attaching the container to the plate including screwing the container both through the first container fixing hole and into the plate.

4. The method of claim 1, wherein the diameter of the column portion is a fraction of the diameter of the second container fixing hole, and the fraction is in a range of about 0.3 to 0.7.

* * * * *